US006174046B1

(12) United States Patent
Reid et al.

(10) Patent No.: US 6,174,046 B1
(45) Date of Patent: Jan. 16, 2001

(54) RELIABLE CONTACT PAD ARRANGEMENT ON PLASTIC PRINT CARTRIDGE

(75) Inventors: W. Bruce Reid, Seattle, WA (US); Mindy A. Hamlin; Arthur K. Wilson, both of San Diego, CA (US); Donald G. Harris, Escondido, CA (US); Majid Azmoon, Poway, CA (US)

(73) Assignee: Hewlett-Packard Company, Palo Alto, CA (US)

( * ) Notice: Under 35 U.S.C. 154(b), the term of this patent shall be extended for 0 days.

(21) Appl. No.: 09/003,411

(22) Filed: Jan. 6, 1998

Related U.S. Application Data

(63) Continuation-in-part of application No. 08/375,046, filed on Jan. 17, 1995, now Pat. No. 5,706,040, and a continuation-in-part of application No. 08/893,775, filed on Jul. 11, 1997, now Pat. No. 5,984,464, which is a continuation-in-part of application No. 08/319,894, filed on Oct. 6, 1994, now Pat. No. 5,648,806.

(51) Int. Cl.[7] .......................................................... B41J 2/14
(52) U.S. Cl. ................................................................ 347/50
(58) Field of Search ................................... 347/20, 50, 84, 347/85, 86, 87, 37

(56) References Cited

U.S. PATENT DOCUMENTS

| 4,755,836 | * | 7/1988 | Ta et al. ................................. 347/37 |
| 4,999,650 |   | 3/1991 | Braun ..................................... 347/58 |
| 5,189,787 |   | 3/1993 | Reed et al. ............................. 29/831 |
| 5,315,472 | * | 5/1994 | Fong et al. ............................. 347/50 |

\* cited by examiner

Primary Examiner—John Barlow
Assistant Examiner—Juanita Stephens

(57) ABSTRACT

The contact pads of a print cartridge are formed on a flexible tape. Each of the uniformly spaced contact pads is preferably a square separated from an adjacent square by a minimum distance to provide each contact pad with a maximum area. Conductive traces run along the flexible tape and between the contact pads to allow for a minimum separation between contact pads, thus allowing the contact pads to be made relatively large. This improves the reliability of the interconnection between the pads and the printer electrodes.

11 Claims, 17 Drawing Sheets

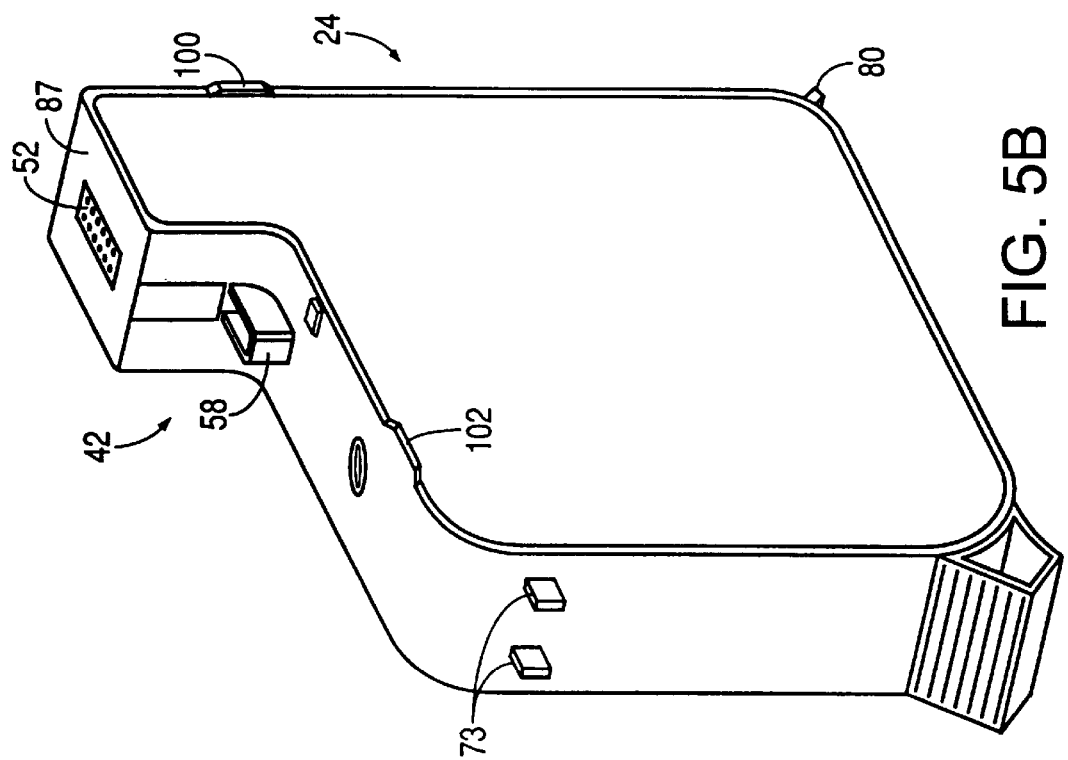
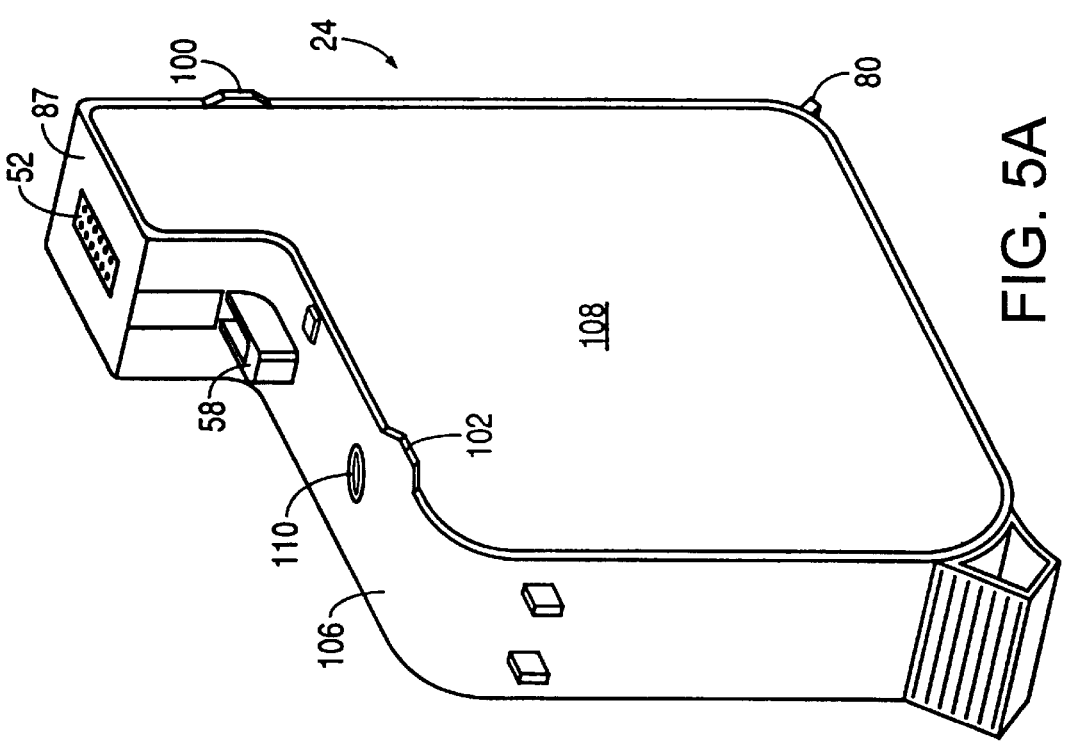
FIG. 5B
FIG. 5A

① Position pre-machined print cartridge 24 having datums 100, 102, and 58 on positioning table 120.

② Optically align targets T1 and T2 on nozzle plate with reference target positions.

③ Machine datums 100 and 102 to maintain alignment of nozzle plate in the X direction in a carriage.

④ Turn print cartridge 24 90° and place on positioning table 129.

⑤ Optically align target T1 or T2 with a reference target position.

⑥ Machine datum 58 to maintain alignment of nozzle plate in the Y direction in a carriage.

⑦ After datums machined, compare alignment of targets T1 and T2 to reference targets on an ideal print cartridge and measure any misalignment.

⑧ Adjust optical alignment software used in steps 2 and 5 to compensate for misalignment.

⑨ Go to step 1

FIG. 7

RELIABLE CONTACT PAD ARRANGEMENT ON PLASTIC PRINT CARTRIDGE

CROSS REFERENCE TO RELATED APPLICATIONS

This application is a continuation-in-part (CIP) of the application entitled "Reliable Contact Pad Arrangement On Plastic Print Cartridge," Ser. No. 08/375,046, filed on Jan. 17, 1995 now U.S. Pat. No. 5,706,040, by W. Bruce Reid et al., and a CIP of the application entitled "Stable Substrate Structure for a Wide Swath Nozzle Array In a High Resolution Inkjet Printer," by Donald Harris et al., Ser. No. 08/893,775, Filed Jul. 11, 1997 which is a continuation of application Ser. No. 08/319,894, Filed Oct. 6, 1994 now U.S. Pat. No. 5,648,806. The above patents and copending applications are assigned to the present assignee and are incorporated herein by reference.

FIELD OF THE INVENTION

The present invention generally relates to ink printers and, more particularly, to the arrangement of contact pads on a print cartridge.

BACKGROUND OF THE INVENTION

Ink-jet printheads operate by ejecting a droplet of ink through a nozzle and onto a recording medium, such as a sheet of paper. When a number of nozzles are arranged in a pattern, such as one or more linear arrays, the properly sequenced ejection of ink from each nozzle causes characters or other images to be printed on the paper as the printhead is moved relative to the paper. The paper is typically shifted each time the printhead has moved across the paper. The printhead is usually part of a disposable print cartridge containing a supply of ink, where the print cartridge is easily installed in and removed from the printer.

In one design of a thermal ink-jet print cartridge, the print cartridge includes: 1) an ink reservoir and ink channels to supply ink proximate to each of the nozzles; 2) a nozzle plate in which the nozzles are formed in a certain pattern; and 3) a substrate attached to a bottom surface of the nozzle plate, where a series of thin film heaters are formed on the substrate, generally one below each nozzle. Each heater includes a thin film resistor and appropriate current leads. To print a single dot of ink, an electrical current from an external power supply is passed through a selected heater. The heater is ohmically heated, in turn superheating a thin layer of the adjacent ink. This results in explosive vaporization of the ink causing a droplet of ink to be ejected through an associated nozzle onto the paper.

One example of this type of print cartridge is shown in FIG. 1 as print cartridge 10. Print cartridge 10 generally includes a body 12 which acts as an ink reservoir. Body 12 may have formed on it one or more projections, such as projection 13, to enable print cartridge 10 to be secured in place within an ink printer. The printhead portion 14 of print cartridge 10 includes a metal nozzle plate 16 (such as a gold-coated nickel plate), which has two parallel arrays of nozzles 17 formed in it using conventional photolithographic techniques. Nozzle plate 16 is attached by an adhesive to an underlying substrate (not shown) which includes heater resistors paired with each of the nozzles 17.

A flexible insulating tape 18 has formed on it a number of conductors which terminate in contact pads 20. The other ends of the conductors on tape 18 are connected, using tape automated bonding (TAB), to electrodes on the substrate.

When print cartridge 10 is properly installed in a moveable carriage of an ink-jet printer, pads 20 contact corresponding electrodes on the ink-jet printer which supply the energization signals to the various heater resistors on the substrate. When printing, the carriage scans print cartridge 10 across the width of a sheet of paper, and the paper is incrementally moved perpendicular to the direction of movement of print cartridge 10.

In FIG. 1, some contact pads 20 are located near a middle portion of plastic body 12. This middle portion of body 12 is prone to sinking during the injection molding process used to form body 12. Typically, this inherent valley created in the middle portion of body 12 is approximately 7 mils deep. When print cartridge 10 is installed in an ink printer, the contact pads 20 located in this valley do not press on the corresponding ink printer electrodes with as much force as the contact pads 20 located toward the sides of body 12. Thus, the precise degree of electrical contact between the printer electrodes and the centrally located contact pads 20 is difficult to predict. Additionally, if the sinking in the middle portion of body 12 is sufficient, the centrally located contact pads 20 may not even make electrical contact with the printer electrodes.

In a color printer, four separate print cartridges 10 are typically used and are carried by the same carriage across the sheet of paper. Typically, one of the four cartridges contains black ink, another contains cyan ink, another contains magenta ink, and another contains yellow ink.

FIG. 2 illustrates the pertinent portion of a color ink-jet printer with four print cartridges 24, 25, 26, and 27 secured within a single carriage 30. Carriage 30 is moved along stationary rod 31 back and forth across the paper sheet 32 in the direction shown by the arrow 34. A roller 35 shifts the position of paper sheet 32 as needed. In an actual embodiment, at least two spaced rollers are used to cause paper sheet 32 to be flat along where print cartridges 24–27 are scanned for printing.

Each of the print cartridges 24–27 may have nozzles 17 (FIG. 1) arranged so as to print, for example, 300 dots per inch (dpi) on paper sheet 32 along an axis perpendicular to arrow 34. This means that a nozzle 17 must be placed approximately every 3 mils along nozzle plate 16 in order to achieve 300 dpi.

In color printing, the various colored dots produced by each of the four print cartridges 24–27 in FIG. 2 are selectively overlapped to create crisp images composed of virtually any color of the visible spectrum. To create a single dot on paper sheet 32 having a color which requires a blend of two or more of the colors provided by print cartridges 24–27, the nozzle plates 16 on each of the cartridges 24–27 must be precisely aligned so that a dot ejected from a selected nozzle 17 in one cartridge overlaps a dot ejected from a corresponding nozzle 17 in another cartridge. This requires each of the nozzle plates 16 on print cartridges 24–27 to be aligned with respect to one another within a few tens of microns after being installed in carriage 30.

In the prior art, the print cartridge bodies 12 of FIG. 1 were made identical to one another so that, when multiple print cartridges 10 were installed in carriage 30, the print cartridge bodies 12 were all aligned with one another in carriage 30 irrespective of any misalignment of the nozzle plates 16 secured to the print cartridge bodies 12.

To align nozzle plate 16 on print cartridge 10 so that nozzle plates are positioned in ideally the same location on all the various print cartridges, nozzle plate 16 is typically glued in position on print cartridge 10 relative to a molded-in plastic datum formed on the print cartridge body 12 itself. This alignment process has a significant drawback in that the adhesive curing process causes nozzle plate 16 to slightly shift as the adhesive is being cured. In addition, molded-in stresses in plastic cartridge body 12 cause shifting of the plastic body during the thermal curing process. Since this movement is substantially unpredictable, this alignment and gluing process can only produce print cartridges whose nozzle plates were positioned to an accuracy of ±35 microns.

Other, more expensive techniques have been used to achieve higher alignment precision. One of these techniques automatically detects any misalignment of the nozzle plates once the print cartridges have been installed in a carriage and then mechanically adjusts the positions of the print cartridges in the carriage. Using another relatively expensive method, an ink drop detector within the ink printer measures the location of a drop of ejected ink after being ejected from a nozzle, and a software algorithm compensates for any misalignment of the nozzle plates. Both of these techniques significantly increase the cost of the ink printer.

Thus, what is needed is an inexpensive and reliable method and structure for improving the alignment of nozzle plates (or other forms of nozzle members) on print cartridges installed in a carriage and an improved print cartridge contact pad arrangement for improving the reliability of electrical contact between the contact pads and electrodes on a printer.

SUMMARY OF THE INVENTION

The contact pads of a print cartridge are formed on a flexible tape. Each of the uniformly spaced contact pads is preferably a square separated from an adjacent square by a minimum distance to provide each contact pad with a maximum area. This allows for a relatively large misalignment between the positioning of the contact pads and the printer electrodes, while still maintaining the proper electrical contact between the contact pads and the printer electrodes.

The contact pads are arranged on the flexible tape only along the edge portions of the plastic print cartridge body, where the body is generally flat, to avoid the pads being located in the sunken middle portion of the body, where the sinking occurs during the injection molding process used to form the body. This improves the reliability of the interconnection between the pads and the printer electrodes.

BRIEF DESCRIPTION OF THE DRAWINGS

FIG. 5a illustrates a print cartridge in accordance with the invention prior to the datum projections being machined.

FIG. 5b illustrates the print cartridge of FIG. 5a after the datum projections have been machined.

FIG. 6 illustrates one embodiment of a machining mechanism and process for accurately machining the datum projections on the print cartridge of FIG. 5a.

FIG. 7 is a flow chart illustrating the basic steps used in the preferred process for machining the datums on the print cartridge of FIG. 5a.

DETAILED DESCRIPTION OF THE PREFERRED EMBODIMENT

Figure 2:
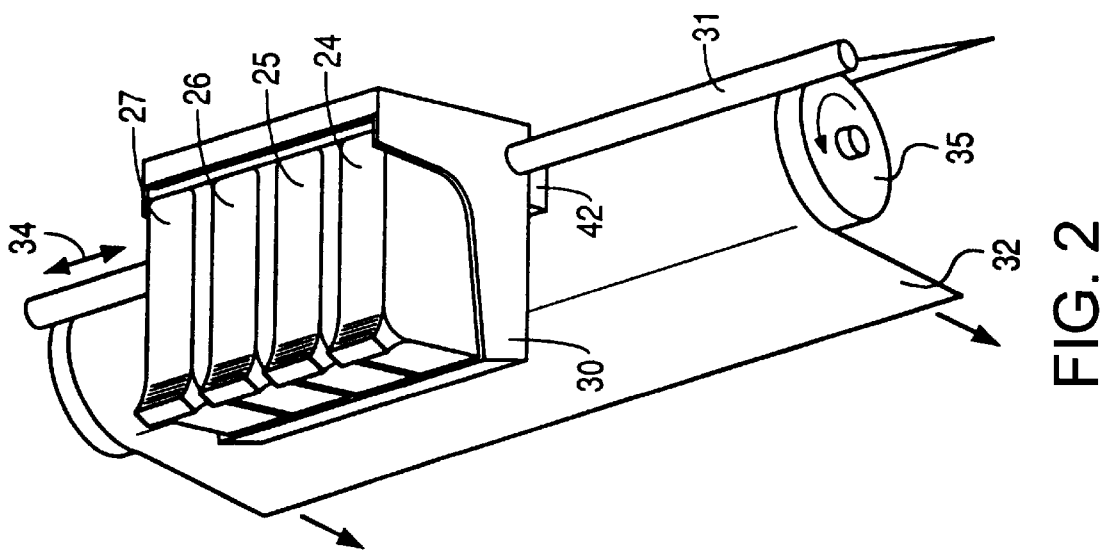
FIG. 2 illustrates a color printer having a movable carriage in which are installed a number of print cartridges for printing different colors of ink.
Figure 1:
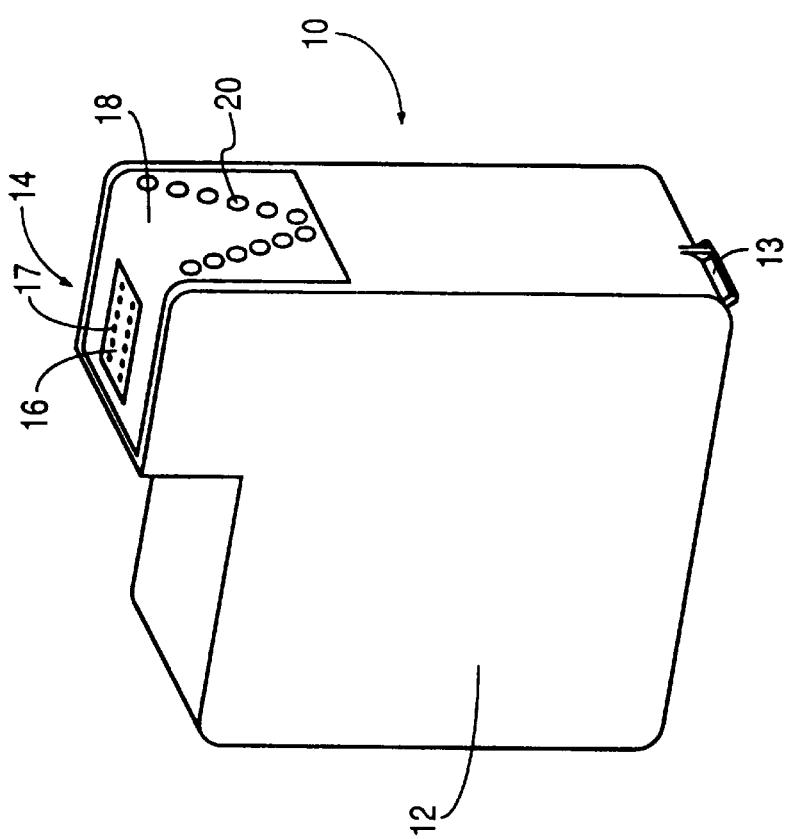
FIG. 1 is a perspective view of a prior art ink cartridge.
Figure 3A:
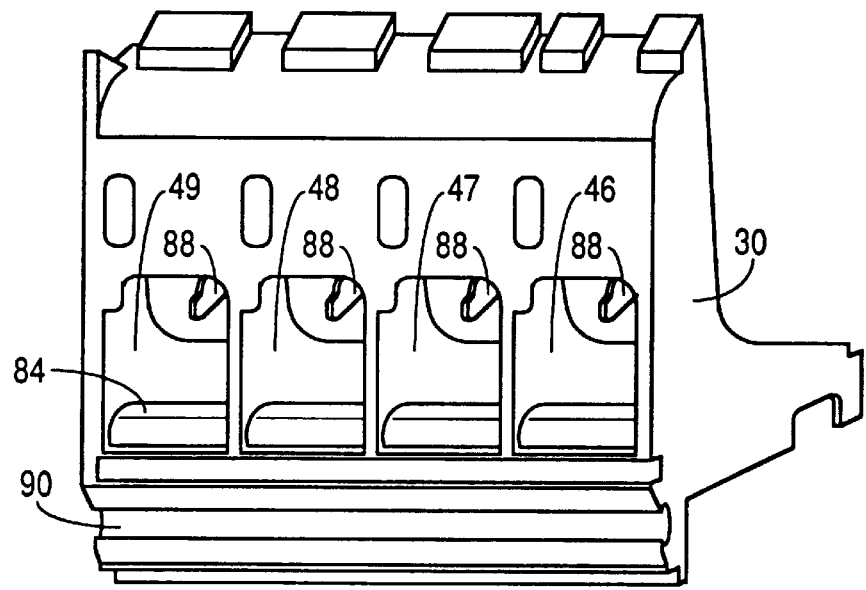
FIG. 3a is a front perspective view of a movable carriage without any print cartridges installed.

FIG. 3a is a front perspective view of the carriage 30 in FIG. 2 without any print cartridges installed.

Figure 3B:
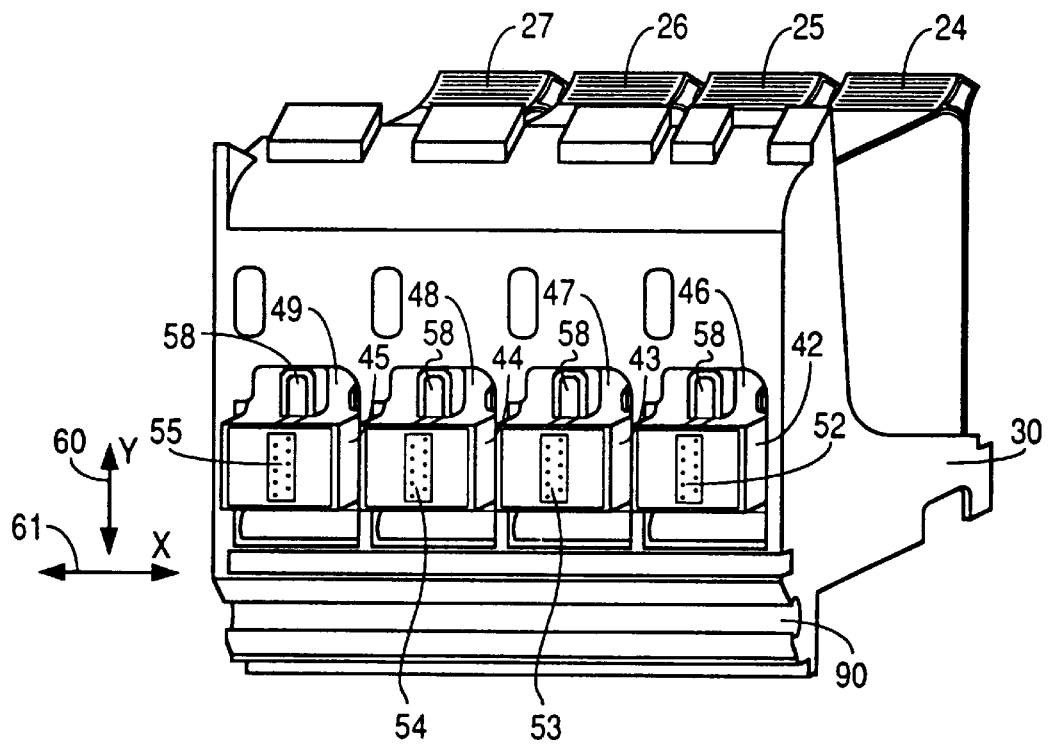
FIG. 3b is a front perspective view of a movable carriage with four print cartridges installed, in accordance with the invention, revealing snout portions of the print cartridges which protrude through the front of the carriage.

FIG. 3b is a front perspective view of the carriage 30 in FIG. 2 containing four separate print cartridges 24, 25, 26, and 27, each similar to the print cartridge 24 shown in FIG. 5b. The snout portions 42, 43, 44, and 45 of the four cartridges are shown protruding through openings 46, 47, 48, and 49, respectively, in carriage 30. FIG. 2 shows a portion of snout 42 of print cartridge 24 extending from carriage 30.

Nozzle plates 52, 53, 54, and 55, (which may be conventional metal nozzle plates) are affixed to snouts 42–45, respectively. Using the preferred embodiment print cartridges, the positions of each of the nozzle plates 52–55 within openings 46–49 are affected by the selective machining of datum projections formed on the print cartridges.

One of the datum projects is shown in FIG. 3b as a Y datum 58. The Y datum 58 is urged against an upper wall of openings 46–49 to define the position of each of nozzle plates 52–55 in the Y direction shown by the arrow 60. The proper machining (or grinding down) of this Y datum 58 on a print cartridge causes the nozzle plate to be precisely positioned within its respective carriage opening 46–49 in the Y direction.

Additional machined datum projections formed on one side of each print cartridge will be described with respect to FIGS. 5a and 5b. The proper machining of these additional datums cause nozzle plates 52–55 (FIG. 3b) to be precisely aligned in the X direction (arrow 61) with virtually zero skew.

Figure 4A:
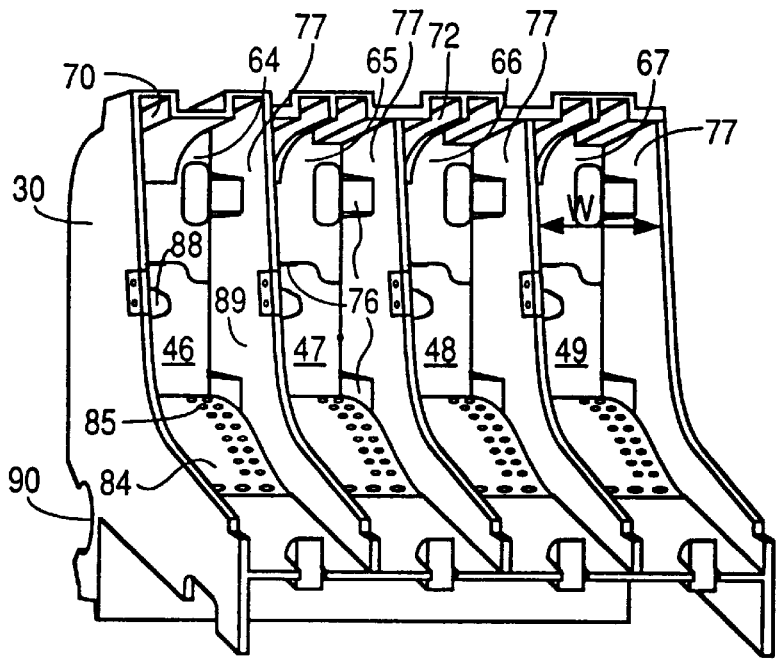
FIG. 4a is a back perspective view of the carriage of FIG. 3 with the print cartridges removed.

FIG. 4a is a perspective view of the back of carriage 30 prior to print cartridges being inserted into carriage 30.

Carriage 30 is preferably injection molded using engineering plastic. This produces a plastic carriage with very consistent features.

Carriage 30 has four stalls 64, 65, 66, and 67, each for receiving one print cartridge, such as print cartridge 24 shown in FIG. 5b. Each of the stalls 64–67 is identical except that stall 64, being intended for a black-ink cartridge, contains a particular pattern of slots 70 which prevent a color-ink print cartridge from being inadvertently inserted into stall 64. A different pattern of slots 72 in color-ink print cartridge stalls 65, 66, and 67 are formed to prevent a black ink cartridge from being inadvertently inserted into stalls 65–67. Mating projections, such as projections 73 in FIG. 5b, are formed on the black ink cartridge body to enable the black-ink cartridge to be fully inserted into stall 64. A different pattern of projections 73 are formed on the color-ink cartridges to allow these color-ink print cartridges to be fully inserted into stalls 65–67.

Each of the stalls 64–67 has an identical width W. Shown are the rectangular openings 46–49 in carriage 30 associated with each of the stalls 64–67 through which the snout portion (e.g., snout portion 42 of FIG. 5b) of the print cartridge extends.

Also shown in FIG. 4a are machined datums 76 along a sidewall 77 of stalls 64–67 and on the upper wall of openings 46–49. These datums 76 are machined so that each of stalls 64–67 provides substantially identical supporting surfaces to print cartridges 24–27. Machined datums 76 are contacted by the three datums 58, 100, and 102 (discussed in detail later with respect to FIG. 5b) on print cartridges 24–27. Accordingly, any variances in the molding process for forming carriage 30 will not affect the carriage's ability to provide an identical supporting environment for each of print cartridges 24–27.

Each of the print cartridges has a projection 80 formed on it, as shown in FIGS. 5a and 5b, which is contacted by spring-loaded arm 82 protruding from a bottom surface of stalls 64–67 to urge the print cartridge against the front wall of carriage 30 and to fictionally secure the cartridge in place.

Each of stalls 64–67 is also equipped with a flexible electrode structure 84 which has raised conductive bumps 85 for contacting the corresponding square contact pads 86 (FIG. 5c) on the print cartridge. The flexible structure 84 preferably has a resilient means, such as a rubber pad, under it so as to urge the conductive bumps 85 against contact pads 86 on the print cartridge and also urge the Y datum 58 (FIG. 3) against the upper wall of an opening 46–49.

In the preferred embodiment print cartridge 24 of FIG. 5b, a substrate (not shown) is connected to the back of nozzle plate 52. The preferred substrate has heater resistors formed on it connected to the outputs of a demultiplexer also formed on the substrate. The signals applied to contact pads 86 are multiplexed so that a relatively few number of contact pads 86 are required to provide the necessary information signals to the substrate to selectively energize the heater resistors. Contact pads 86 are connected to electrodes on the substrate via conductors formed on flexible tape 87. One of ordinary skill in the art may fabricate such a substrate including a multiplexer or other decoder using conventional techniques.

A spring-loaded arm 88 (FIGS. 3a and 4a), which may be metal or plastic, is provided for each stall 64–67 to urge the print cartridge against datum surfaces 76 on sidewall 77 (FIG. 4a) of the stall.

Carriage 30 is also provided with a rod receiving hole 90 (FIG. 3b) for receiving rod 31 (FIG. 2) to enable carriage 30 to only be movable in the X direction across a sheet of paper 32.

Figure 4B:
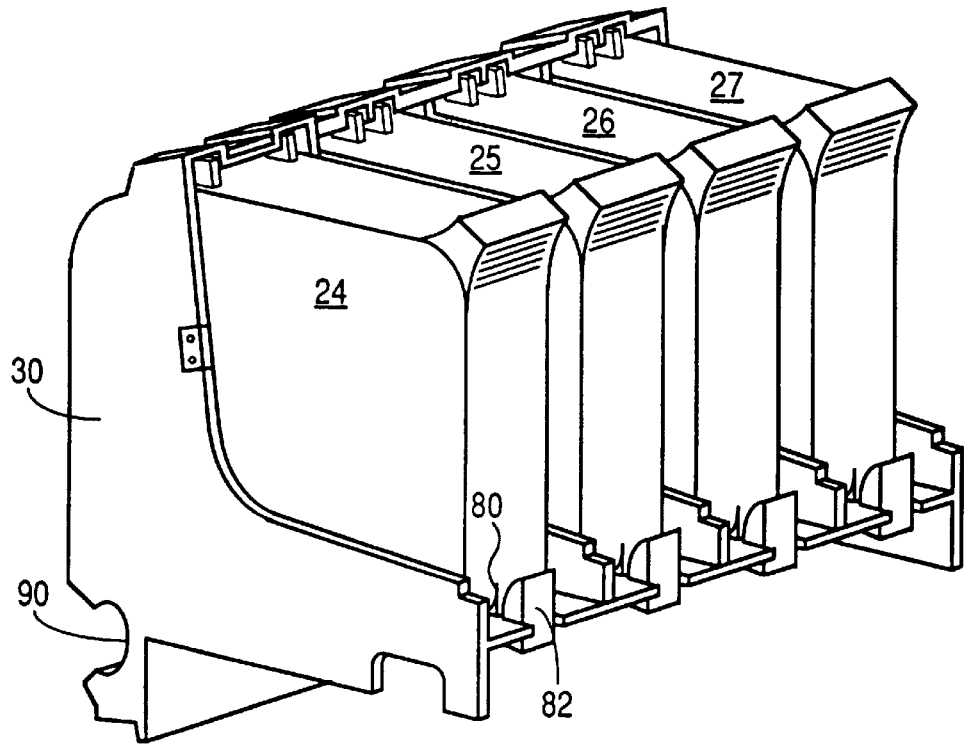
FIG. 4b is a back perspective view of the carriage of FIG. 4a with the print cartridges installed.

FIG. 4b shows the carriage 30 of FIG. 4a with four print cartridges 24, 25, 26, and 27 installed.

In a completed carriage 30, a printed circuit board would be affixed to a bottom surface (in the orientation of FIG. 4a) of carriage 30 and connected to the flexible electrode structure 84; however, such electronic circuitry forms no part of this invention and has been eliminated for simplicity.

Each of the print cartridges is provided with datum projections 100, 102, and 58, as shown in FIG. 5a. These datum projections are formed integral with the plastic portion 106 of the print cartridge, which is preferably injection molded using engineering plastic. In the preferred embodiment, the sidewalls 108 of the print cartridge are of a stamped sheet metal. These sidewalls fit within the injection molded portion 106 of the print cartridge and protect a reservoir containing liquid ink. In another embodiment, the entire print cartridge body is injection molded.

An ink fill-hole 110 is shown for filling the print cartridge with ink.

The geometry of the datums 100, 102, and 58 determines the precise X and Y position of the print cartridge within carriage 30, as well as any skewing of the cartridge, since datums 100 and 102 directly contact datums 76 (FIG. 4a) formed on sidewall 77 of each of stalls 64–67 (FIG. 4a), and datum 58 contacts datum 76 (FIG. 4a) formed on an upper wall of each of the openings 46–49 formed in the front surface of carriage 30 (FIG. 3b).

More specifically, the heights of datums 100 and 102 affect the positioning of nozzle plates 52–55 (FIG. 3) along the X direction within carriage 30, while the relative heights of datums 100 and 102 with respect to one another control the skew of the nozzle plates 52–55.

FIG. 3b shows how the end portion of the datum 58 directly affects the positioning of nozzle plates 52–55 in the Y direction, since this end portion directly contacts datums 76 (FIG. 4a) formed on the upper wall of the openings 46–49.

Thus, by selectively machining datums 100, 102, and 58 to remove portions of these datums, the X, Y, and skew positioning of the nozzle plates 52–55 with respect to carriage 30 may be adjusted to precisely align nozzle plates 52–55 with respect to one another.

FIG. 5b shows an example of print cartridge 24 of FIG. 5a after datums 100, 102 and 58 have been machined to reduce their dimensions so as to cause nozzle plate 52 on print cartridge 24, after being installed in carriage 30, to be precisely positioned relative to carriage 30.

Figure 5C:
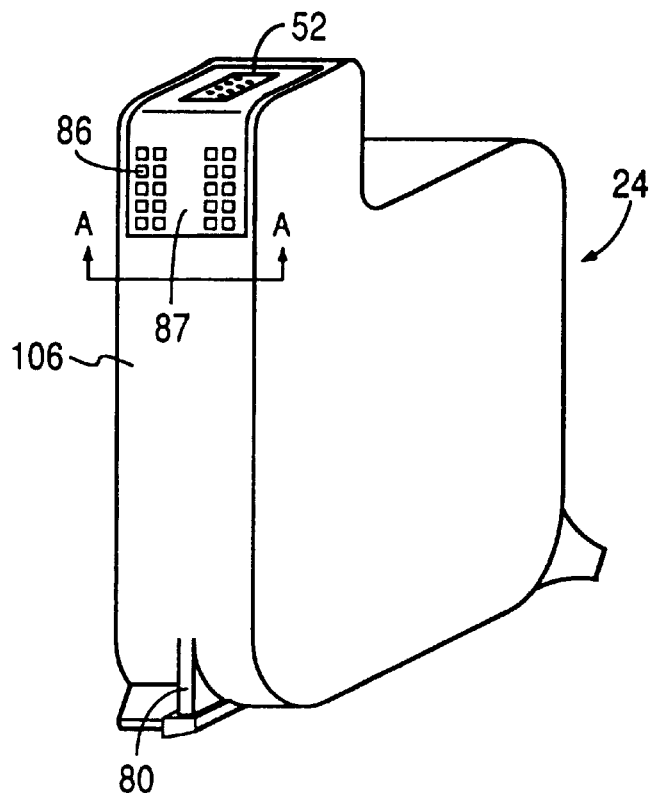
FIG. 5c is a different perspective of the print cartridge of FIG. 5b showing the arrangement of contact pads.

FIG. 5c shows a different perspective of print cartridge 24 of FIG. 5b, revealing the contact pads 86 of print cartridge 24 formed on flexible tape 87. Each of the uniformly spaced contact pads 86 is preferably a square separated from an adjacent square by a minimum distance to provide each contact pad 86 with a maximum area. This allows for a relatively large misalignment between the positioning of contact pads 86 and the conductive bumps 85 on the flexible electrode structure 84 in carriage 30, while still maintaining the proper electrical contact between the conductive bumps 85 and contact pads 86. Prior art contact pads are typically circular, which allows for much less misalignment tolerance than with square contact pads.

Of course, in an actual product there would be many more contact pads 86 and nozzles formed in nozzle plate 52 than shown in the drawings. The specific number of contact pads 86 and nozzles will depend on the specific requirements of the printhead portion of the print cartridge and the multiplexing circuitry formed on the substrate.

Figure 5D:
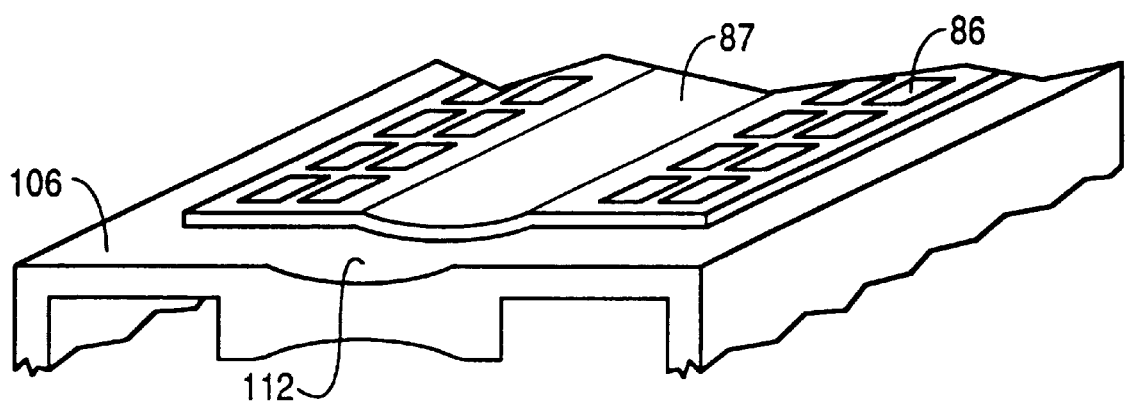
FIG. 5d is a cross-section along line A—A in FIG. 5c illustrating further detail of the arrangement of contact pads on the print cartridge of FIG. 5c.

Additionally, as shown in the cross-section of FIG. 5d taken along line A—A in FIG. 5c, the middle portion of the plastic print cartridge body 106 is prone to sinking during the injection molding process. This causes a valley 112 approximately 7 mils deep in the center of the cartridge body. Contact pads 86 are arranged on flexible tape 87 only along the side portions of the body 106, where body 106 is generally flat, to avoid pads 86 being located in valley 112. This improves the reliability of the interconnection between pads 86 and conductive bumps 85 on the flexible electrode structure 84 in carriage 30. Flexible tape 87 may be glued to the print cartridge body 106 using any suitable adhesive or heat-staked to body 106 at selected points on tape 87.

Figure 5E:
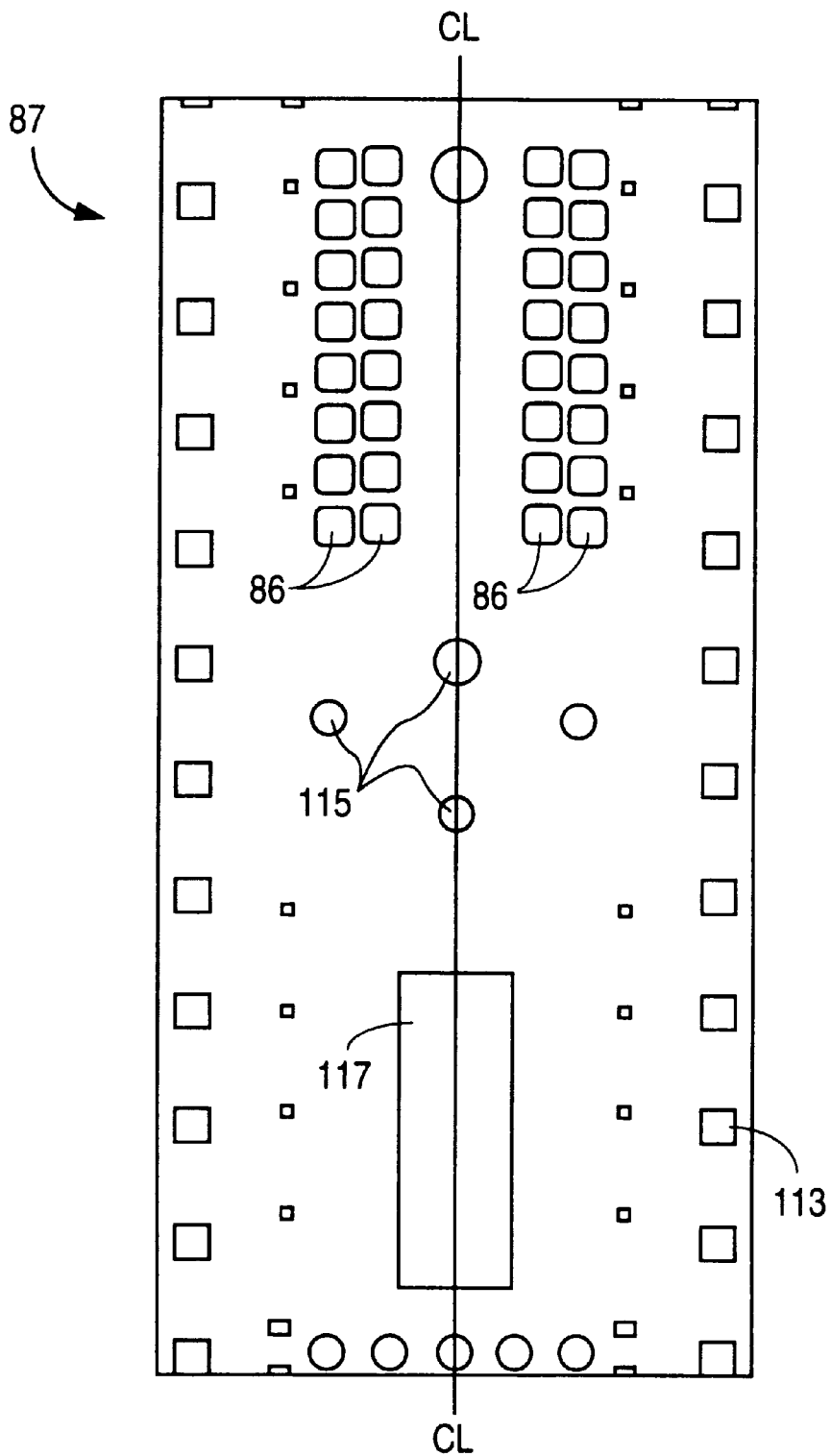
FIGS. 5e and 5f illustrate in greater detail an actual embodiment of the preferred contact pad arrangement on a flexible circuit prior to a printhead being connected to the flexible circuit.

FIG. 5e illustrates the contact pad 86 arrangement on a front surface of an actual embodiment of flexible tape 87 as provided by a manufacturer, such as 3M Corporation. This front surfaces faces away from the print cartridge body when tape 87 is secured to a print cartridge.

Figures 5F, 5G:
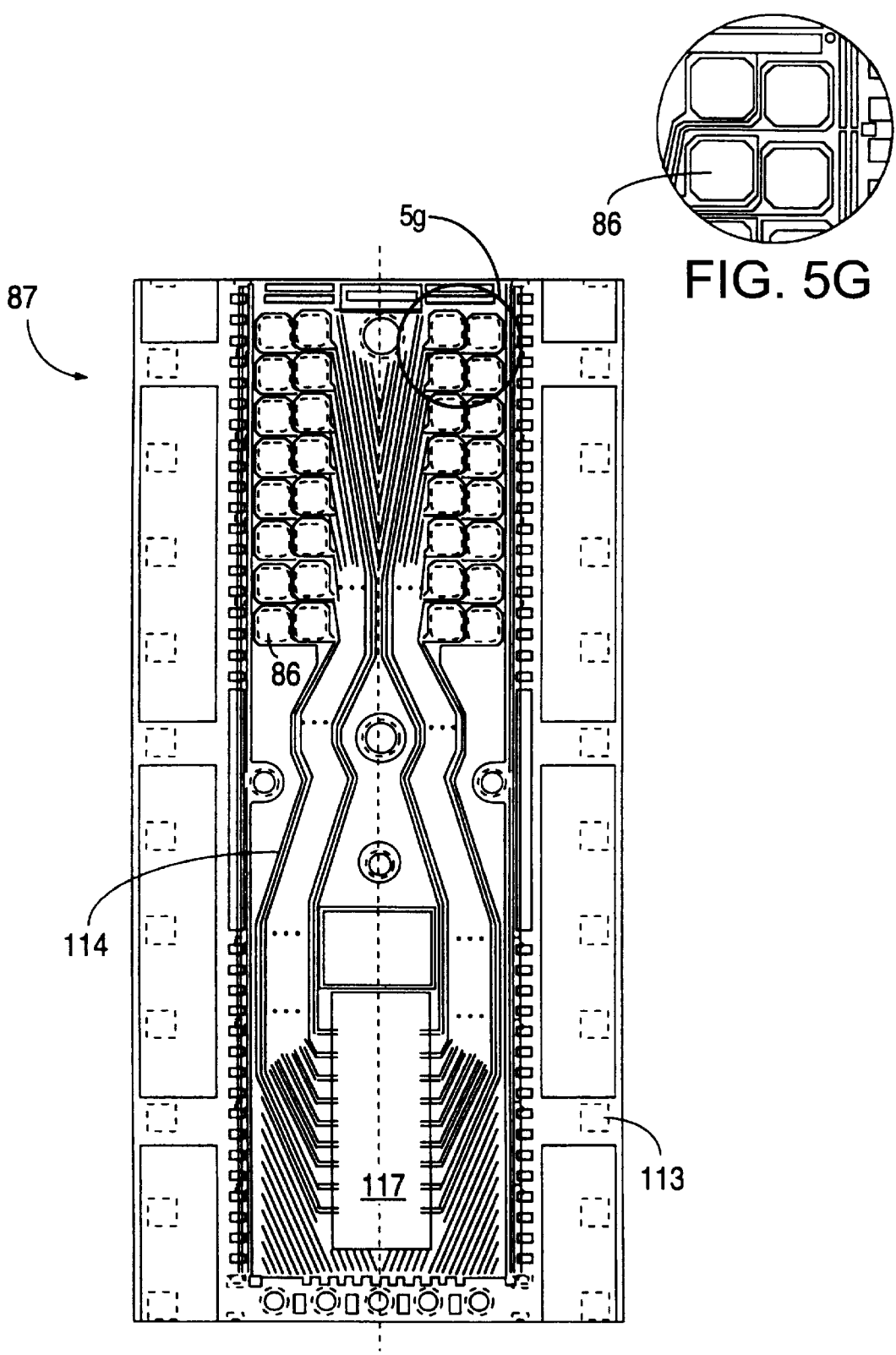

FIG. 5f shows the reverse side of tape 87, exposing the various conductors 114 connected to contact pads 86.

Tape 87 may be formed of a polymer such as Kapton™, Upilex™, or their equivalent. Sprocket holes 113 are formed to facilitate transport of tape 87 (typically provided on a reel) so that tape 87 may be used in a step-and-repeat process for bonding substrate electrodes to the conductors 114 (FIG. 5f) on tape 87. The edge portions of tape 87 containing sprocket holes 113 are later cut off.

Contact pads 86 are shown being substantially square shaped and having sides approximately 0.06 inches (1.52 mm) long. In the embodiment of FIG. 5e, two parallel columns of contact pads 86 are shown on both sides of the center line CL, where the adjacent columns are slightly offset (e.g., by 0.37 mm) to enable conductors 114 to extend between contact pads 86 as shown in the magnified portion of FIG. 5f.

A number of tooling holes 115 are provided in tape 87 to facilitate handling and alignment of tape 87.

Adjacent contact pads 86 in the two parallel columns are separated by less than approximately 0.25 mm. The separation between the two inner columns is approximately 4.5 mm to avoid any pads 86 being located in valley 112 of FIG. 5d when tape 87 is secured to a print cartridge.

Conductors 114 and contact pads 86 are preferably copper or an alloy (e.g., beryllium copper) which have been formed on the back surface of tape 87 (FIG. 5f) using a conventional plating and photolithographic etching process. To expose contact pads 86 on the front surface of tape 87 (FIG. 5e), holes must be formed through tape 87. The exposed contact pads 86 are preferably then plated with gold.

The other ends of conductors 114 lead to window 117 for bonding to electrodes of a printhead substrate. Preferably, the printhead substrate incorporates a demultiplexer connected to heater resistors so that the number of required contact pads 86 and conductors 114 may be held to a minimum for receiving multiplexed printhead energizing signals.

A preferred embodiment method for selectively machining datums 100, 102 and 58, after assembly of the print cartridge has been fully completed, will now be described with respect to FIGS. 6 and 7. This method is suitable for high-volume manufacturing.

Figure 6:
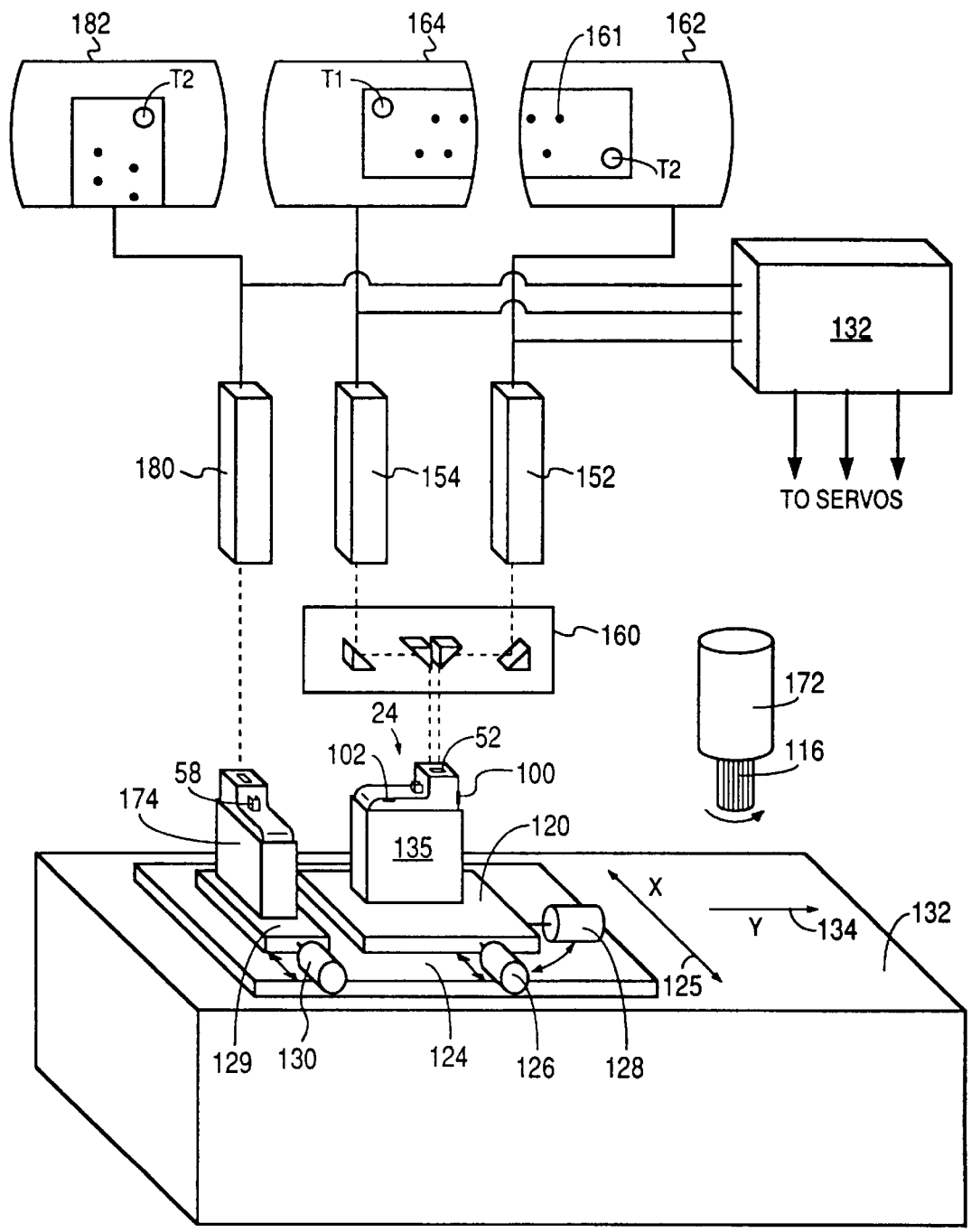

FIG. 6 illustrates the basic mechanisms which are used to manipulate the position of print cartridge 24 so as to align target markings on nozzle plate 52 with sample targets contained in a memory. Once the target markings are aligned, print cartridge 24 is moved past a rotating router bit 116 which machines datums 100, 102 and 58 to have the required dimensions. When multiple print cartridges are then installed in carriage 30, the positions of the various nozzle plates will be precisely aligned with respect to the carriage and with respect to each other.

A first positioning table 120 is shown which may be rotated through an angle or shifted in the X direction with respect to a support table 124.

The rotation of positioning table 120 and its shifting in the X direction (shown by arrow 125) are accomplished by the use of servo 126 and servo 128.

A second positioning table 129 may only be shifted in the X direction by the use of servo 130. Servos 126, 128, and 130 are individually controlled by a computer 132 to move positioning tables 120 and 129 relative to support table 124.

Base table 132 provides an air bearing and a guide means for support table 124 to allow support table 124 to move in only a Y direction (shown by arrow 134) with respect to base table 132.

In the first step of the process to precisely machine datums 100, 102 and 58, a print cartridge 24 is removed from a conveyor belt (not shown) by, for example, a robotic arm (not shown) and placed in a receptacle 135 secured to positioning table 120. Receptacle 135 is designed to securely retain print cartridge 24 such that stresses are applied against the print cartridge 24 body that are similar to those that would be experienced by print cartridge 24 when installed in carriage 30 (FIG. 4b). This step is illustrated as step 1 in the flow chart of FIG. 7.

Next, camera 152 detects an image of a first end of nozzle plate 52, and camera 154 detects an image of an opposite end of nozzle plate 52. An optical system 160 is used to direct the optical axes of cameras 152 and 154 to the proper portions of nozzle plate 52.

Nozzle plate 52 has formed in it a first target hole T1 in one corner of nozzle plate 52 and a second target hole T2 formed in an opposite corner of nozzle plate 52. These target holes T1 and T2 are approximately 1 mil in diameter and are formed using the same mask that is used to form the nozzles 161 in nozzle plate 52 so that target holes T1 and T2 are inherently aligned with nozzles 161.

The images detected by cameras 152 and 154 are shown on CRTs 162 and 164, respectively. The image on CRT 162 shows the right end of nozzle plate 52 containing target hole T2 in the bottom corner of nozzle plate 52. CRT 164 shows the image of the left end of nozzle plate 52 containing target hole T1 in the upper corner of nozzle plate 52.

The position of target T2, as detected by camera 152, is compared to a stored reference target position of an ideal print cartridge relative to router bit 116 to determine whether target hole T2 is aligned with the reference target position. Techniques for performing such an alignment comparison are conventional and generally compare bits within a first bit-mapped memory, storing the target T2 image, to bits within a second bit-mapped memory, storing the reference target position. The difference in the bit positions corresponding to the target T2 and the reference target position is then determined.

If the target T2 is not aligned with the reference target position in the X direction, computer 132 provides signals to servo 126 to push or pull positioning table 120 the required amount so that the target T2 is matched to the reference target position.

At the same time, the position of target T1, as detected by camera 154, is compared to a reference target position of an ideal print cartridge relative to router bit 116 to determine whether target T1 on nozzle plate 52 is out of alignment with the reference target, position. If target TI is out of alignment, computer 132 signals servo 128 to rotate positioning table 120 the required amount so that target T1 is aligned with the reference target position.

At this point, both targets T1 and T2 should be precisely aligned in the X direction with respect to support table 124 and with respect to a fixed router assembly 172. This step is shown as step 2 in FIG. 7.

Router assembly 172 preferably incorporates an air bearing so that the rotating router bit 116 produces virtually no vibration.

The movable support table 124 is then moved in a Y direction (as shown by arrow 134) to cause print cartridge 24 to pass rotating router bit 116 in order to machine the datums 100 and 102 to the required height so that when print cartridge 24 is installed in carriage 30, nozzle plate 52 will be aligned in the X direction and have virtually zero skew. This step is shown as step 3 in FIG. 7.

In order to now machine datum 58 to align nozzle plate 52 in the Y direction within carriage 30, support table 124 is shifted into its initial position, and a robotic arm (not shown) turns print cartridge 24 ninety degrees and places print cartridge 24 into receptacle 174 secured to positioning table 129. This step is shown as step 4 in FIG. 7. Receptacles 135 and 174 may incorporate an air cylinder to apply a proper amount of pressure against a side of print cartridge 24 to emulate the pressure print cartridge 24 would experience in stalls 64–67 (FIG. 4a) in carriage 30. Preferably, receptacle 174 contacts datums 100 and 102 on print cartridge 24 since datums 100 and 102 would be contracted by a wall of carriage 30.

A camera 180 then focuses on nozzle plate 52 so that target T2 is imaged on CRT 182. (Imaging of target T1, along with any necessary adjustments in software, would be equivalent to imaging target T2.) Computer 132 then sends signals to servo 130 to cause positioning table 129 to be pushed or pulled in the X direction to cause target T2 to match a reference target position stored in memory of an ideal print cartridge relative to router bit 116. This step is shown as step 5 in FIG. 7.

Once target T2 is aligned with the reference target position in memory, support table 124 is shifted in the Y direction so as to cause print cartridge 24 to pass the router bit 116 to machine the end portion of datum 58. This step is shown as step 6 in FIG. 7.

The resulting print cartridge 24 is then removed from positioning table 129 using the robotic arm and placed back on the conveyor belt. The robotic arm then takes another print cartridge and performs the identical operations.

As the finished print cartridges leave the machining process, they are tested to determine whether the datums 100, 102, and 58 have been correctly machined with respect to the nozzle plate. This testing is performed by effectively placing a finished print cartridge in a simulated carriage 30 stall and comparing the positions of targets T1 and T2 on the nozzle plate to the positions of corresponding reference targets on an ideal print cartridge. Such a comparison is performed using two cameras to detect targets T1 and T2. This step is shown in step 7 of FIG. 7.

Any recurring differences between the position of the nozzle plate on the actual print cartridge and on the ideal cartridge are fed back to computer 132 in FIG. 6. This information is then used by computer 132 to automatically change the reference target positions in memory to compensate for these recurring differences. This feedback correction provided to the machining apparatus of FIG. 6 compensates for any mechanical wear and tear or other changes which naturally arise with extended use. This step is shown in step 8 of FIG. 7. Accordingly, virtually the same machining precision is maintained over the life of the apparatus shown in FIG. 6.

Numerous other machining apparatuses and methods may be used to machine the datums 100, 102, and 58 to provide the proper alignment of the nozzle plates on multiple print cartridges when installed in carriage 30.

Accordingly, a novel print cartridge structure, a method for aligning nozzle plates of multiple print cartridges within a carriage, and a method for machining datums on a print cartridge have been described in detail.

Figure 8:
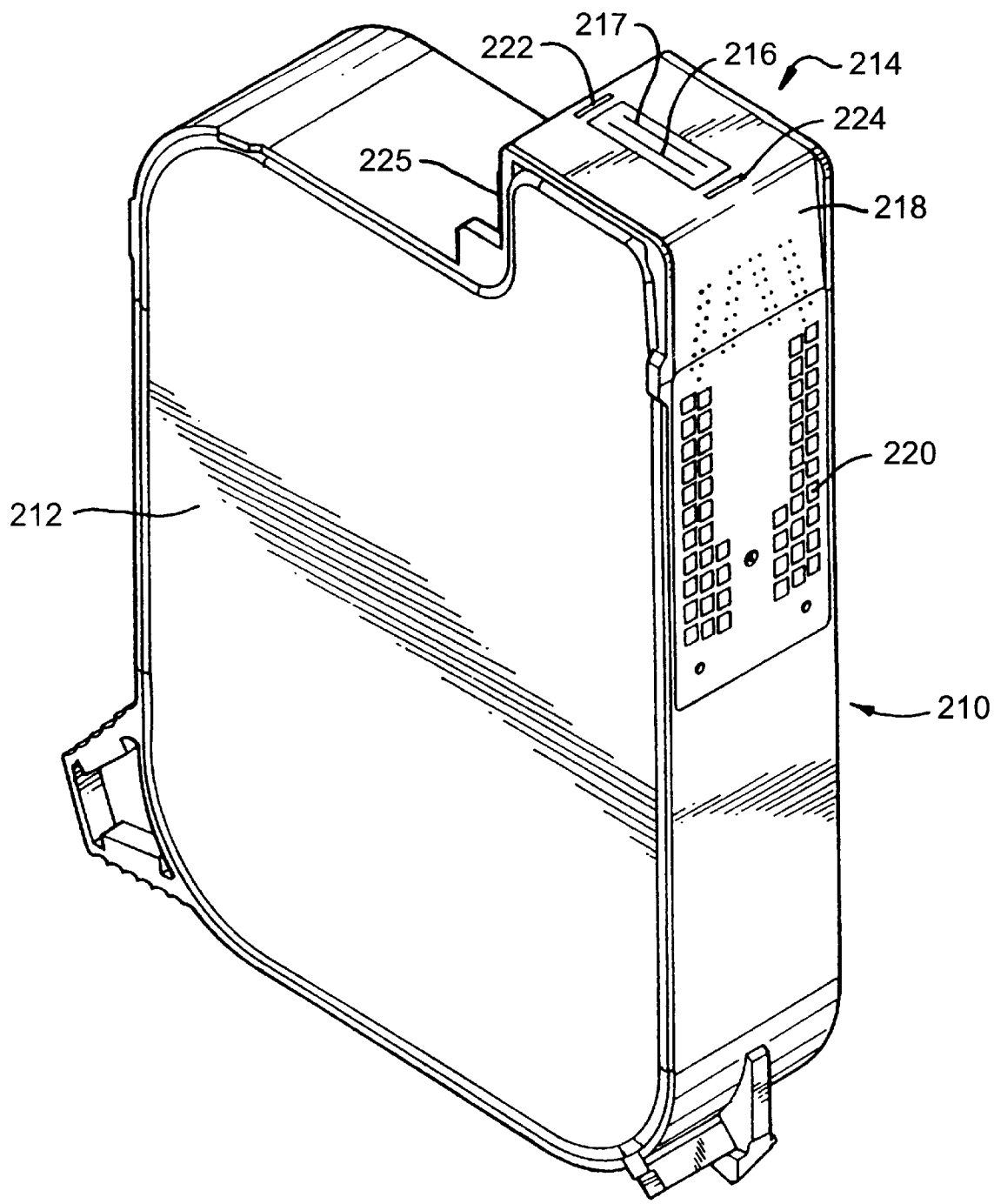
FIG. 8 is a perspective view of an inkjet print cartridge according to one embodiment of the present invention.

FIGS. 8–13 illustrate another embodiment of a print cartridge using the novel flex-circuit. Referring to FIG. 8, reference numeral 210 generally indicates an inkjet print cartridge, incorporating a printhead, according to one embodiment of the present invention simplified for illustrative purposes. The inkjet print cartridge 210 includes an ink reservoir 212 and a printhead 214, where the printhead 214 is formed using Tape Automated Bonding (TAB). The printhead 214 (hereinafter "TAB head assembly 214") includes a nozzle member 216 comprising two parallel columns of offset holes or orifices 217 formed in a flexible polymer flexible circuit 218 by, for example, laser ablation.

A back surface of the flexible circuit 218 includes conductive traces 236 (FIG. 9A) formed thereon using a conventional photolithographic etching and/or plating process. These conductive traces 236 are terminated by large contact pads 220 designed to interconnect with a printer. The print cartridge 210 is designed to be installed in a printer so that the contact pads 220, on the front surface of the flexible circuit 218, contact printer electrodes providing externally generated energization signals to the printhead.

Windows 222 and 224 extend through the flexible circuit 218 and are used to facilitate bonding of the other ends of the conductive traces 236 to electrodes on a silicon substrate containing heater resistors. The windows 222 and 224 are filled with an encapsulant to protect any underlying portion of the traces and substrate.

In the print cartridge 210 of FIG. 8, the flexible circuit 218 is bent over the back edge of the print cartridge "snout" and extends approximately one half the length of the back wall 225 of the snout. This flap portion of the flexible circuit 218 is needed for the routing of conductive traces 236 which are connected to the substrate electrodes through the far end window 222. The contact pads 220 are located on the flexible circuit 218 which is secured to this wall, and the conductive traces 236 are routed over the bend and are connected to the substrate electrodes through the windows 222, 224 in the flexible circuit 218.

Figure 9A:
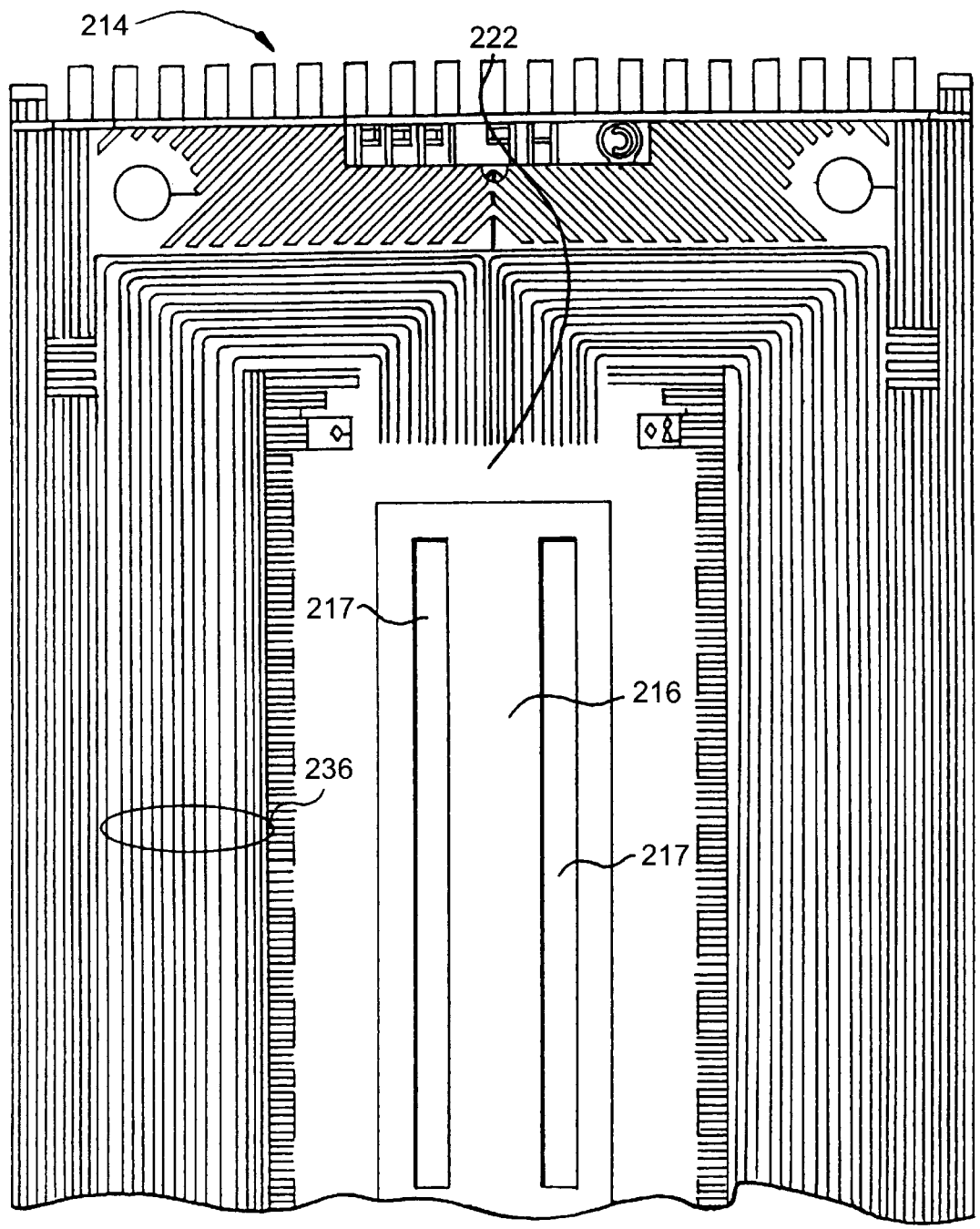
FIGS. 9A, 9B and 9C are views of the front surface of the Tape Automated Bonding (TAB) printhead assembly (hereinafter "TAB head assembly") removed from the print cartridge of FIG. 8.
Figure 9B:
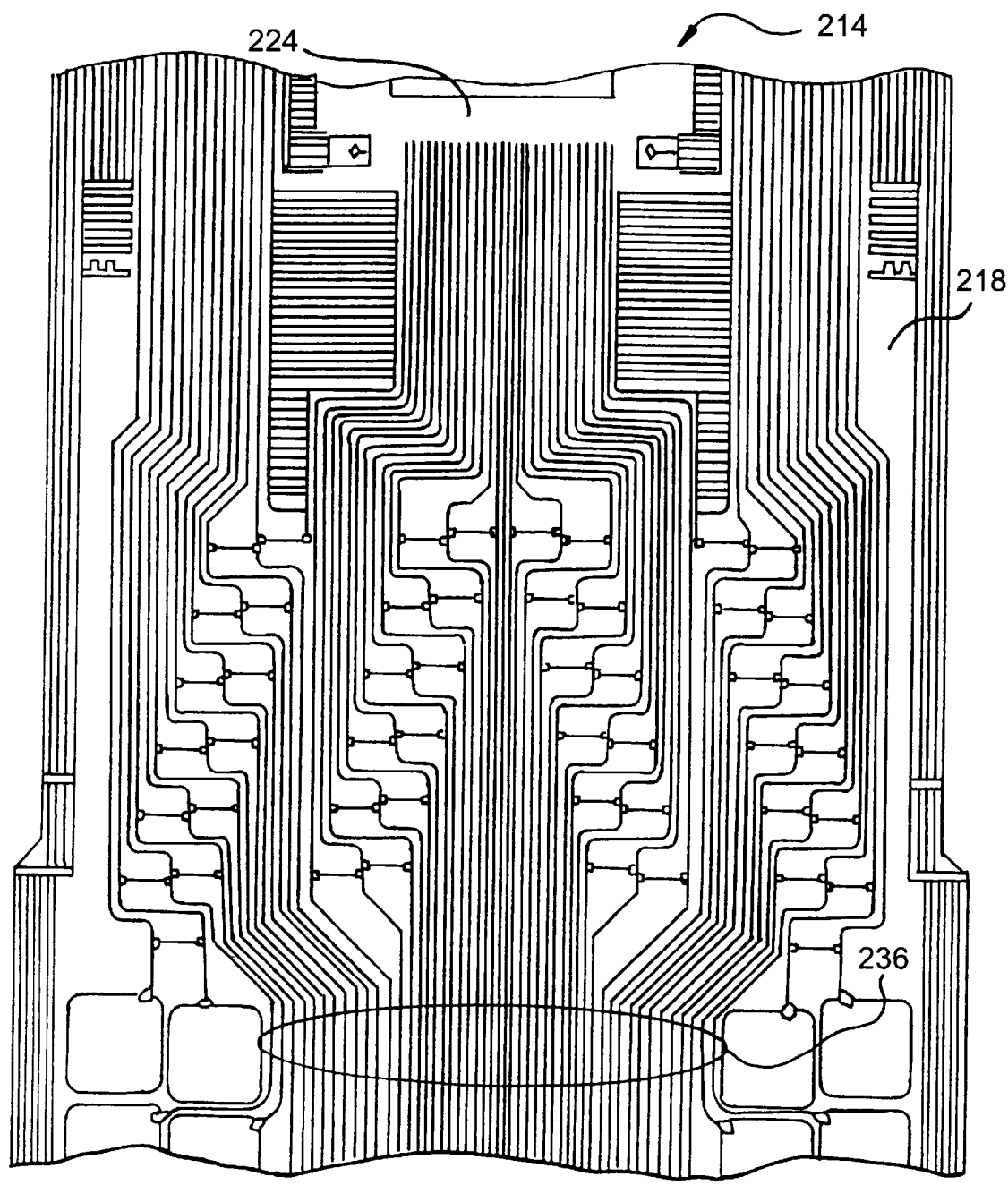
Figure 9C:
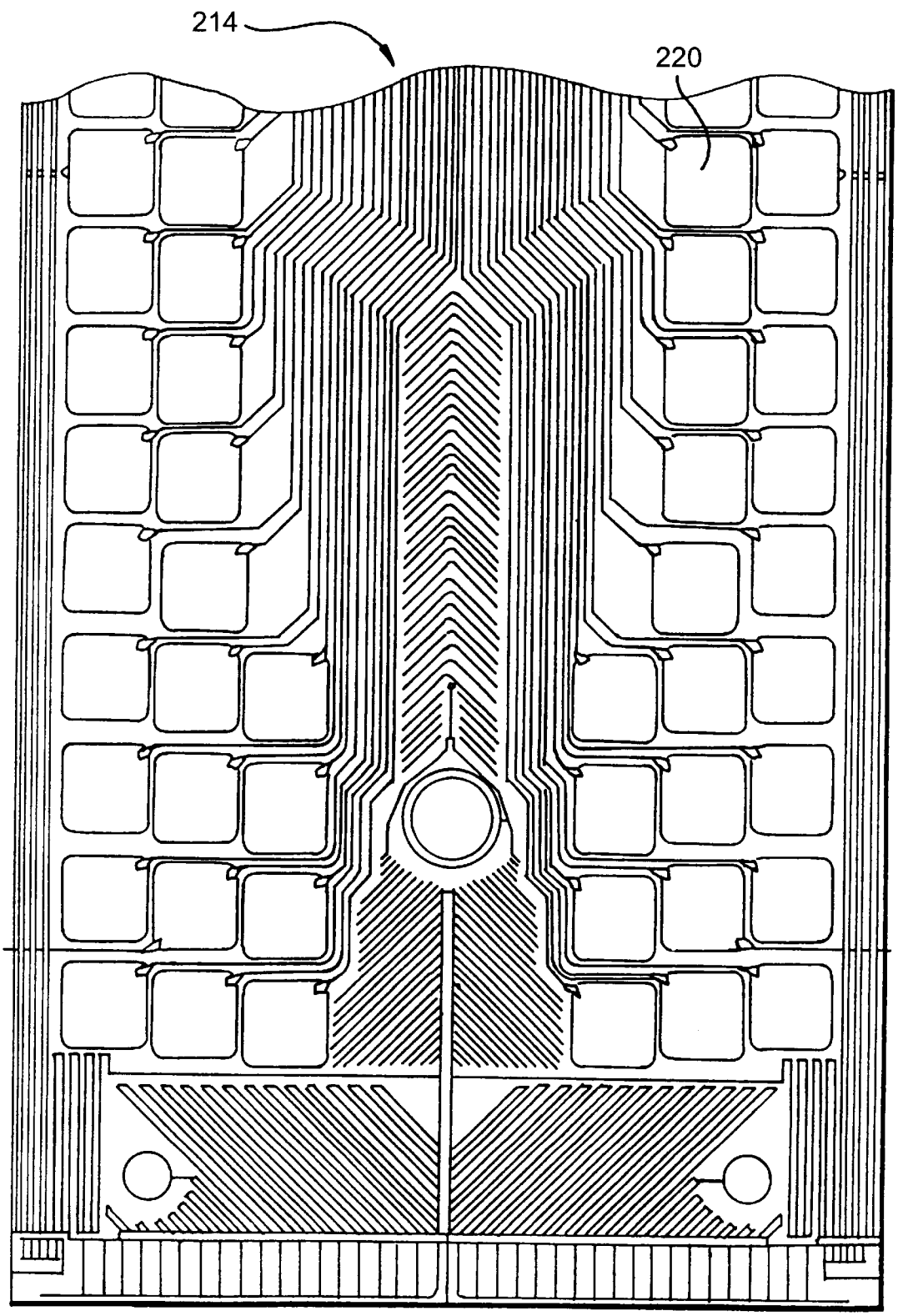

FIGS. 9A, 9B, and 9C show a front view of the TAB head assembly 214 of FIG. 8 removed from the print cartridge 210 and prior to windows 222 and 224 in the TAB head assembly 214 being filled with an encapsulant. TAB head assembly 214 has affixed to the back of the flexible circuit 218 a silicon substrate (not shown) containing a plurality of individually energizable thin film resistors. Each resistor is located generally behind a single orifice 217 and acts as an ohmic heater when selectively energized by one or more pulses applied sequentially or simultaneously to one or more of the contact pads 220.

The orifices 217 and conductive traces 236 may be of any size, number, and pattern, and the various figures are designed to simply and clearly show the features of the invention. The relative dimensions of the various features have been greatly adjusted for the sake of clarity.

The orifice 217 pattern on the flexible circuit 218 shown in FIGS. 9A–9C may be formed by a masking process in combination with a laser or other etching means in a step-and-repeat process, which would be readily understood by one of ordinary skill in the art after reading this disclosure.

In one embodiment, the substrate is approximately one-half inch long and contains 300 heater resistors, thus enabling a resolution of 600 dots per inch. The heater resistors may instead be any other type of ink ejection element, such as a piezoelectric pump-type element or any other conventional element. Also formed on the substrate are electrodes for connection to the conductive traces 236 formed on the back of the flexible circuit 218.

A demultiplexer is also formed on the substrate for demultiplexing the incoming multiplexed signals applied to the electrodes and distributing the signals to the various thin film resistors. The demultiplexer enables the use of much fewer electrodes than thin film resistors. Having fewer electrodes allows all connections to the substrate to be made from the short end portions of the substrate, as shown in FIG. 9A, so that these connections will not interfere with the ink flow around the long sides of the substrate. The demultiplexer may be any decoder for decoding encoded signals applied to the electrodes. The demultiplexer has input leads connected to the electrodes and has output leads connected to the various resistors.

Also formed on the surface of the substrate using conventional photolithographic techniques is a barrier layer, which may be a layer of photoresist or some other polymer, in which is formed the vaporization chambers and ink channels. A portion of the barrier layer insulates the conductive traces from the underlying substrate. Additional detail is found in U.S. Pat. No. 5,648,806, incorporated herein by reference.

Referring to FIGS. 8 and 9A–9C, the print cartridge 210 is designed to be installed in a printer so that the contact pads 220, on the front surface of the flexible circuit 218, contact printer electrodes which couple externally generated energization signals to the TAB head assembly. To access the traces 236 on the back surface of the flexible circuit 218 from the front surface of the flexible circuit, holes (vias) are formed through the front surface of the flexible circuit to expose the ends of the traces. The exposed ends of the traces are then plated with, for example, gold to form the contact pads 220 shown on the front surface of the flexible circuit in FIGS. 9A–9C.

In one embodiment of the invention disclosed herein, we have combined a 600 dpi ½ swath black pen with three 300 dpi color pens each generating a swath of approximately ⅓. The high performance black pen is typically used for printing text and other "black only" features, and thus the output quality and throughput of these features is greater. It also improves the output quality of color graphics and color features by teaming with the three lower performance color pens when printing color graphics or color features. The black component of the graphics which is often a large portion of color graphics content is at a higher resolution and thus at a higher output quality level. The larger swath can then be combined with printing algorithms to improve the throughput of color graphics.

Figure 10:
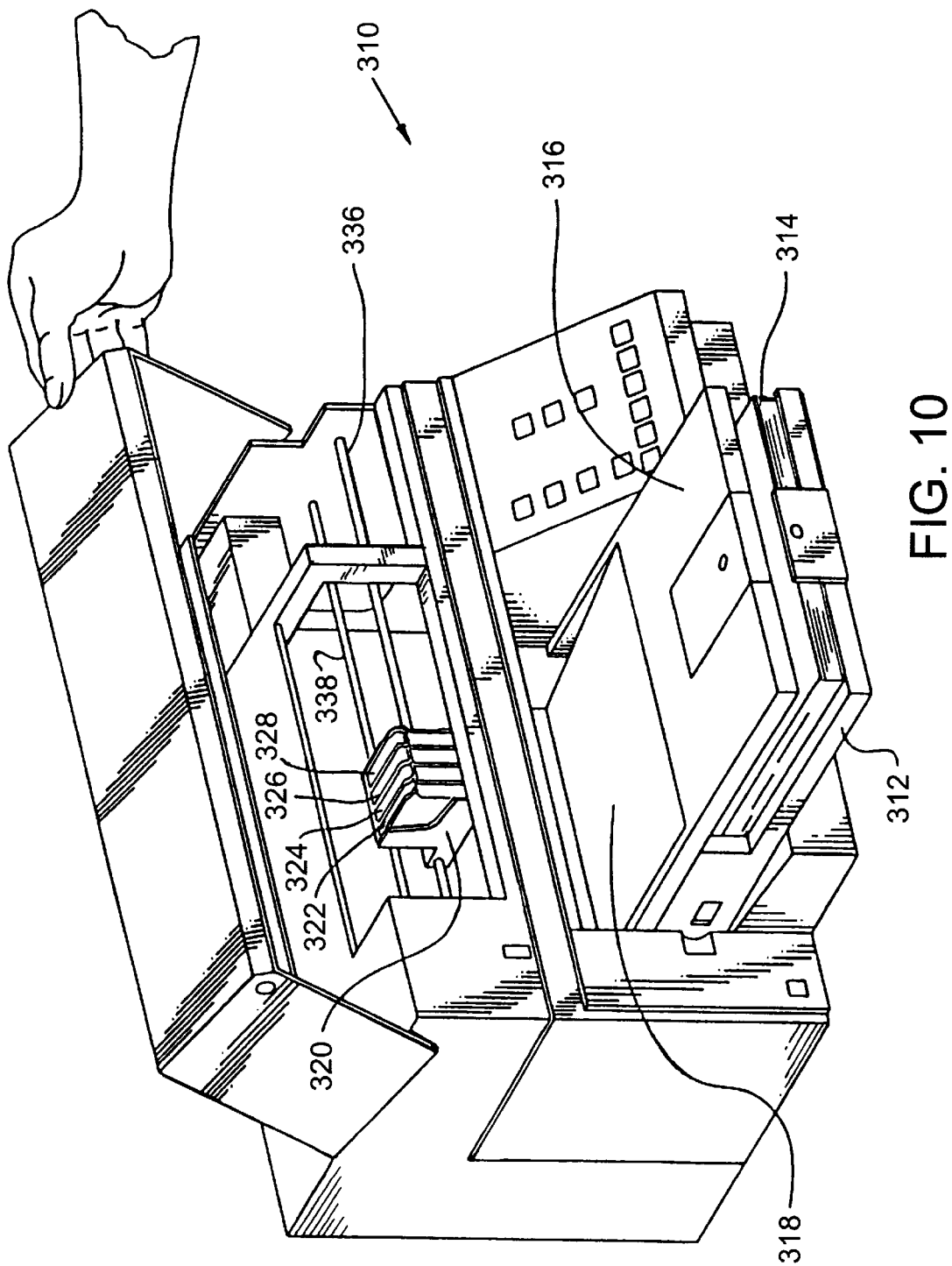
FIG. 10 shows a typical inkjet printer which incorporates the print cartridges of the present invention.
Figure 11:
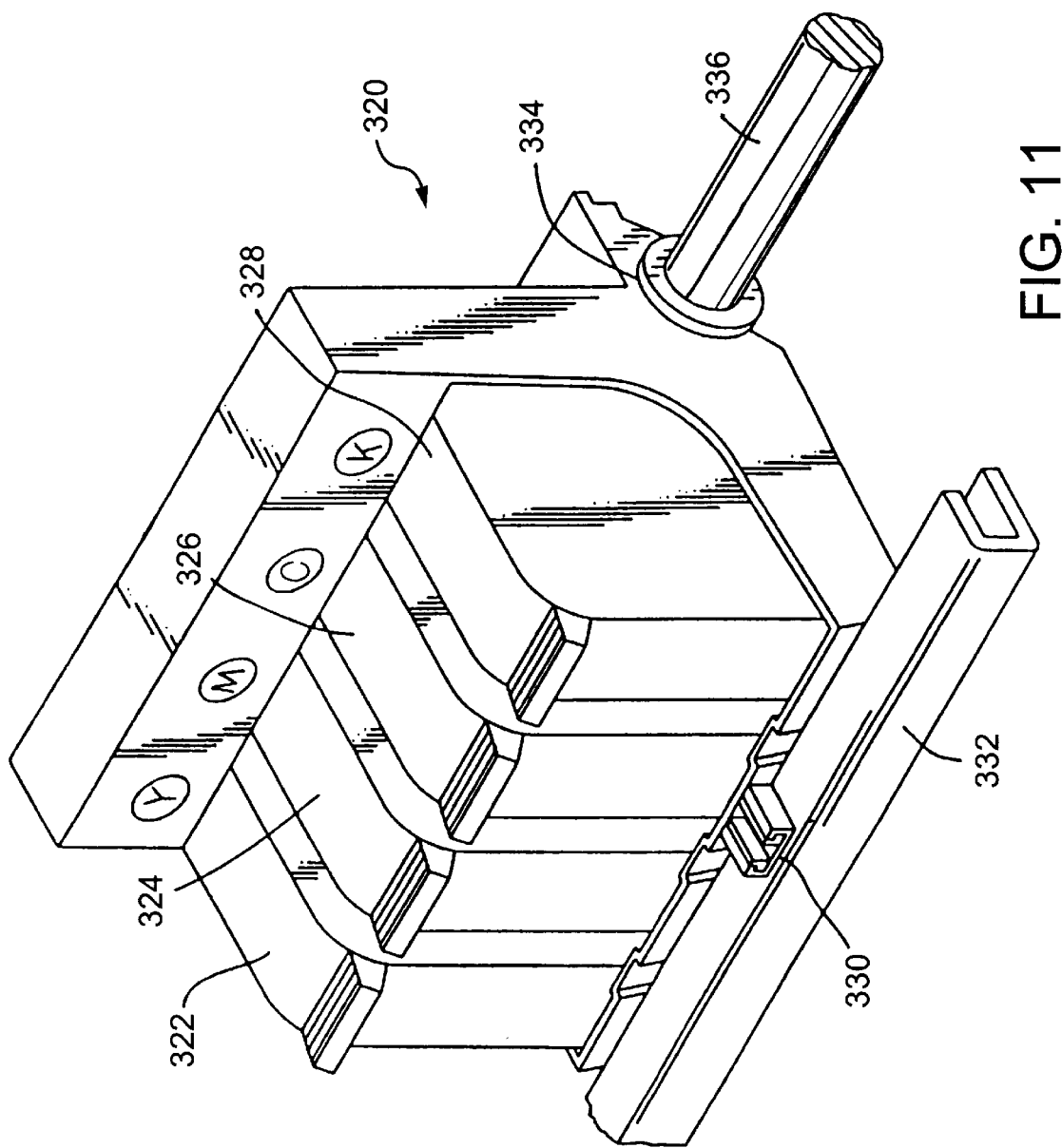
FIG. 11 shows a carriage having removable multi-color print cartridges incorporating the present invention.

Even though the invention can be used in any printing environment where text and/or graphics are applied to media using monochrome and/or color components, the presently preferred embodiment of the invention is used in an inkjet printer of the type shown in FIG. 10. In particular, inkjet printer 310 includes an input tray 312 containing sheets of media 314 which pass through a print zone, and are fed past an exit 318 into an output tray 316. Referring to FIGS. 10 and 11, a movable carriage 320 holds print cartridges 322, 324, 326, and 328 which respectively hold yellow (Y), magenta (M), cyan (c) and black (K) inks. The front of the carriage has a support bumper 330 which rides along a guide 332 while the back of the carriage has multiple bushings such as 334 which ride along slide rod 336. The position of the carriage as it traverses back and forth across the media is determined from an encoder strip 338 in order to be sure that the various ink nozzles on each print cartridge are selectively fired at the appropriate time during a carriage scan.

Figure 12:
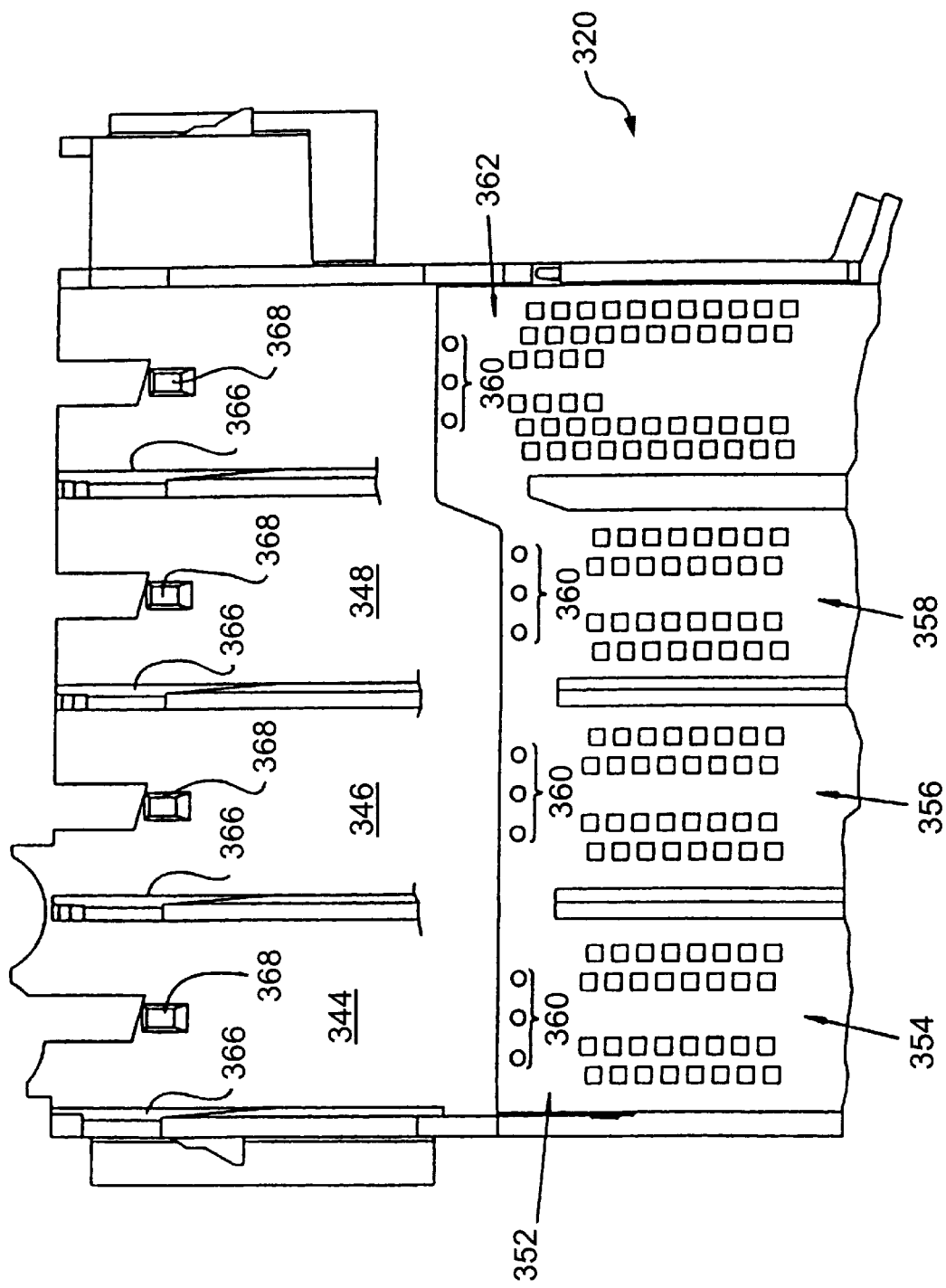
FIG. 12 is a fragmentary view of the flex-circuit interconnect on a carriage with the interior carriage walls cut away.

Referring to FIGS. 11 and 12, a 300 dpi color inkjet cartridge 322 having a tab-circuit with a four column thirty-two pad electrical interconnect is removably installed in three chutes 344, 346, 348 of a unitary carriage 320. A flex-circuit member 352 having three matching sets of conductive pads 354, 356, 358 is mounted on flex-frame pins 360 for operative engagement with the cartridge pads when the cartridge is inserted into its appropriate chute. An enlarged set of conductive pads 362 covering a larger area, having a different layout, and constituting an array of six columns totaling fifty-two conductive pads on the flex-circuit member is designed for operative engagement with cartridge pads on a 600 dpi black inkjet cartridge 328. Datums 366 and 368 are shown in FIG. 12 for precise positioning of the print cartridges.

Figure 13:
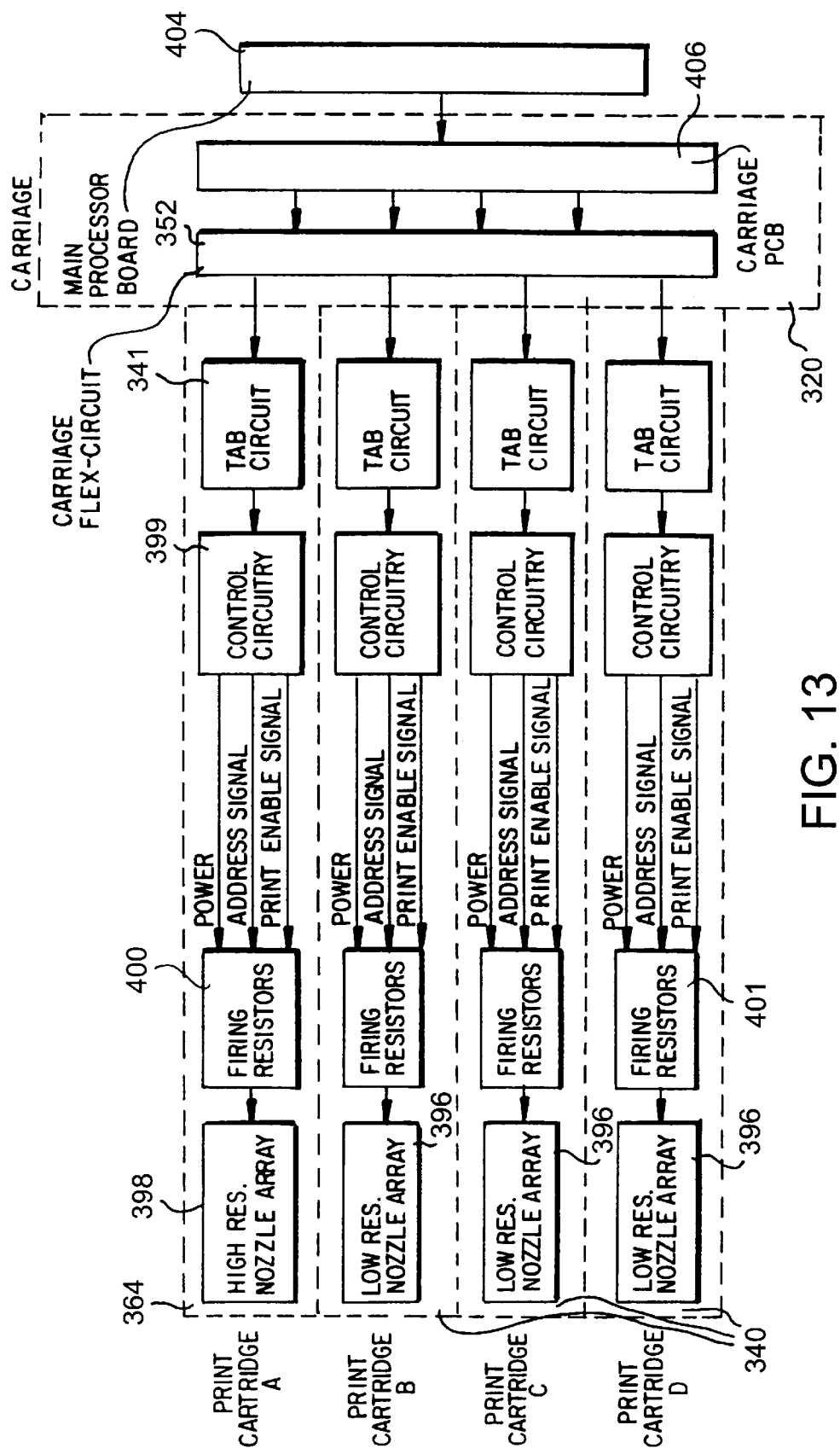
FIG. 13 is a schematic block diagram of a printer embodiment of the invention.

FIG. 13 shows the preferred mounting relationship between a 300 dpi nozzle array 396 of the color print cartridge 340 and a 600 dpi nozzle array 398 of the black print cartridge 364. Control circuitry 399 on the substrate enables the three hundred firing resistors 400 of the black printhead to be controlled through fifty-two electrical interconnect pads, and similarly enables all one hundred four firing resistors 401 of each color printhead to be controlled through thirty-two electrical interconnect pads.

A printer main processing board 404, carriage printed circuit board 406, carriage flex-circuits 352, and TAB circuits 341 are also shown.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention. For example, any type of nozzle plate may be used with this invention, including polymer nozzle members formed in a flexible TAB circuit.

What is claimed is:

1. A print cartridge comprising:
a print cartridge body having a first side; and
a flexible circuit secured on at least said first side of said print cartridge body, said flexible circuit comprising:
an insulating flexible tape having a length and a width;
a first set of contact pads formed on said flexible tape for contacting corresponding electrodes in an ink printer, said first set of contact pads being arranged in rows and columns along a first edge portion of said flexible tape and having a first width;
a second set of contact pads formed on said flexible tape for contacting corresponding electrodes in an ink printer, said second set of contact pads being arranged in rows and columns along a second edge portion of said flexible tape and having a second width;

conductive traces formed on said flexible tape, said traces running between a printhead electrode contact area and said contact pads, said traces running in a lengthwise direction from said printhead electrode contact area along a middle portion of said flexible tape such that there are no traces running between columns of said first set of contact pads and between columns of said second set of contact pads; and a region on said flexible tape between said first set of contact pads and said second set of contact pads that does not contain any contact pads, said region having a width at least as wide as said first width and at least as wide as said second width, and a length at least as long as said columns in said first and second sets of contact pads.

2. The cartridge of claim 1 wherein said traces run between rows of contact pads in a direction perpendicular to a lengthwise centerline of said flexible tape when contacting contact pads along outer edges of said flexible tape to minimize a gap between said contact pads in adjacent columns and adjacent rows of said contact pads.

3. The cartridge of claim 2 wherein said contact pads in a row along said outer edges of said flexible tape are staggered to provide space between contact pads in adjacent rows for said traces to run to contact said contact pads.

4. A printing system comprising:

a scanning carriage for scanning across a print zone in an inkjet printer, said scanning carriage having at least one receptacle for receiving a print cartridge, said scanning carriage including electrodes for contacting contact pads on a print cartridge;

a print cartridge installed in said at least one receptacle, said print cartridge comprising:
  a print cartridge body having a first side; and
  a flexible circuit secured on at least said first side of said print cartridge body, said flexible circuit comprising:
    an insulating flexible tape having a length and a width;
    a first set of contact pads formed on said flexible tape for contacting corresponding electrodes in an ink printer, said first set of contact pads being arranged in rows and columns along a first edge portion of said flexible tape and having a first width;
    a second set of contact pads formed on said flexible tape for contacting corresponding electrodes in an ink printer, said second set of contact pads being arranged in rows and columns along a second edge portion of said flexible tape and having a second width;
    conductive traces formed on said flexible tape, said traces running between a printhead electrode contact area and said contact pads, said traces running in a lengthwise direction from said printhead electrode contact area along a middle portion of said flexible tape such that there are no traces running between columns of said first set of contact pads and between columns of said second set of contact pads; and
    a region on said flexible tape between said first set of contact pads and said second set of contact pads that does not contain any contact pads, said region having a width at least as wide as said first width and at least as wide as said second width, and a length at least as long as said columns in said first and second sets of contact pads.

5. The system of claim 4 wherein said traces run between rows of contact pads in a direction perpendicular to a lengthwise centerline of said flexible tape when contacting contact pads along outer edges of said flexible tape to minimize a gap between said contact pads in adjacent columns and adjacent rows of said contact pads.

6. The system of claim 5 wherein said contact pads in a row along said outer edges of said flexible tape are staggered to provide space between contact pads in adjacent rows for said traces to run to contact said contact pads.

7. The system of claim 4 wherein said at least one receptacle comprises a plurality of receptacles, and wherein said print cartridge is a first print cartridge, installed in one of said receptacles, printing at an ink drop resolution of 300 dots per inch, said system also comprising:

a second print cartridge, installed in another of said receptacles, printing at an ink drop resolution of 600 dots per inch, said second print cartridge comprising:
  a second print cartridge body having a first side;
  a flexible circuit secured on at least said first side of said second print cartridge body, said flexible circuit comprising:
    an insulating flexible tape having a length and a width;
    a first set of contact pads formed on said flexible tape for contacting corresponding electrodes in an ink printer, said first set of contact pads being arranged in rows and columns along a first edge portion of said flexible tape and having a first width;
    a second set of contact pads formed on said flexible tape for contacting corresponding electrodes in an ink printer, said second set of contact pads being arranged in rows and columns along a second edge portion of said flexible tape and having a second width;
    conductive traces formed on said flexible tape, said traces running between a printhead electrode contact area and said contact pads, said traces running in a lengthwise direction from said printhead electrode contact area along a middle portion of said flexible tape such that there are no traces running between columns of said first set of contact pads and between columns of said second set of contact pads; and
    a region on said flexible tape between said first set of contact pads and said second set of contact pads that does not contain any contact pads, said region having a width at least as wide as said first width and at least as wide as said second width, and a length at least as long as said columns in said first and second sets of contact pads.

8. A printing system comprising:

a scanning carriage for scanning across a print zone in an inkjet printer, said scanning carriage having at least one receptacle for receiving a print cartridge, said scanning carriage including electrodes for contacting contact pads on a print cartridge; and a print cartridge installed in said at least one receptacle, said print cartridge comprising:
  a print cartridge body including a first side having a depressed valley along a middle portion of said first side running along a length of said first side; and a flexible circuit secured on at least said first side of said print cartridge body, said flexible circuit having contact pads formed thereon for contacting corresponding electrodes in an ink printer, said flexible circuit having conductive traces terminating in said contact pads for connection to a printhead, said flexible circuit having a width larger than a width of said valley and so that a middle portion of said flexible circuit running a length of said flexible circuit secured to said first side overlies said valley, none of said contact pads on said flexible circuit being formed in said middle portion of said flexible circuit where said flexible circuit overlies said valley.

9. The system of claim 8 wherein said traces run between rows of contact pads in a direction perpendicular to a lengthwise centerline of said flexible circuit when contacting contact pads along outer edges of said flexible circuit.

10. The system of claim 9 wherein said contact pads formed in a row along said outer edges of said flexible circuit are staggered to provide space between contact pads in adjacent rows for said traces to run to contact said contact pads formed in a row along said outer edges.

11. The system of claim 8 wherein said at least one receptacle comprises a plurality of receptacles, and wherein said print cartridge is a first print cartridge, installed in one of said receptacles, said system also comprising:

a second print cartridge, installed in another of said receptacles, said second print cartridge comprising:
a second print cartridge body including a first side having a depressed valley along a middle portion of said first side running along a length of said first side; and
a flexible circuit secured on at least said first side of said second print cartridge body, said flexible circuit having contact pads formed thereon for contacting corresponding electrodes in an ink printer, said flexible circuit having conductive traces terminating in said contact pads for connection to a printhead, said flexible circuit having a width larger than a width of said valley and so that a middle portion of said flexible circuit running a length of said flexible circuit secured to said first side overlies said valley, none of said contact pads on said flexible circuit being formed in said middle portion of said flexible circuit where said flexible circuit overlies said valley.

* * * * *